United States Patent
Surampudi et al.

(10) Patent No.: US 9,429,628 B2
(45) Date of Patent: Aug. 30, 2016

(54) APPLICATION INDEPENDENT MAP-BASED CYCLE LIFE TESTING OF BATTERY CELLS

(71) Applicant: Southwest Research Institute, San Antonio, TX (US)

(72) Inventors: Bapiraju Surampudi, San Antonio, TX (US); Joe Steiber, Spring Branch, TX (US); Jeff Qiang Xu, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 594 days.

(21) Appl. No.: 13/892,949

(22) Filed: May 13, 2013

(65) Prior Publication Data

US 2014/0333313 A1 Nov. 13, 2014

(51) Int. Cl.
*H02J 7/00* (2006.01)
*G01R 31/36* (2006.01)
*H01M 10/48* (2006.01)

(52) U.S. Cl.
CPC ....... *G01R 31/3679* (2013.01); *G01R 31/3693* (2013.01); *H01M 10/48* (2013.01); *G01R 31/3627* (2013.01); *G01R 31/3651* (2013.01)

(58) Field of Classification Search
USPC ........................................................ 320/132
See application file for complete search history.

(56) References Cited

U.S. PATENT DOCUMENTS

| | | | |
|---|---|---|---|
| 5,307,000 A | * | 4/1994 | Podrazhansky et al. ...... 320/129 |
| 2004/0151976 A1 | * | 8/2004 | Palazzo et al. ................ 429/50 |
| 2004/0161660 A1 | * | 8/2004 | Syracuse et al. .............. 429/50 |
| 2005/0001625 A1 | * | 1/2005 | Ashtiani et al. .............. 324/426 |
| 2007/0029970 A1 | * | 2/2007 | Barsukov et al. ............ 320/130 |
| 2010/0235024 A1 | | 9/2010 | Uchida |
| 2010/0250162 A1 | | 9/2010 | White et al. |
| 2012/0274285 A1 | | 11/2012 | Chawla et al. |

OTHER PUBLICATIONS

"Battery Test Manual for Plug-In Hybrid Electric Vehicles"; Idaho National Laboratory (iNL); INL/EXT-07-12536; US Dept. of Energy Vehicle Technologies Program; Mar. 2008 (68 pgs).

* cited by examiner

*Primary Examiner* — Samuel Berhanu
(74) *Attorney, Agent, or Firm* — Grossman, Tucker et al.

(57) ABSTRACT

A method and system for application independent map-based cycle life testing of battery cells is provided. A target depth of discharge (DOD) and a charge/discharge current level is selected for the battery test. The battery is discharged to the target DOD. The battery is cycled within the DOD range one or more times, wherein the cycling comprises a charge pulse and a discharge pulse at the selected current levels. A reference performance test (RPT) is performed on the battery, wherein the RPT comprises a static capacity test and a dynamic power test. The cycling and RPT testing are repeated until an end of test condition is detected.

17 Claims, 7 Drawing Sheets

300

| | ΔDOD | | | | | |
|---|---|---|---|---|---|---|
| | 5% | 10% | 20% | 40% | 60% | 100% |
| High Current | 2 | 1 | 2 | 3 | - | - |
| Medium Current | 3 | 1 | 2 | 1 | 3 | - |
| Low Current | - | 3 | 2 | 1 | 2 | 1 |

FIG. 3

APPLICATION INDEPENDENT MAP-BASED CYCLE LIFE TESTING OF BATTERY CELLS

FIELD OF INVENTION

The present disclosure relates to cycle life testing of battery cells, and in particular to application independent map-based cycle life testing of battery cells including lithium-ion cells.

BACKGROUND

Batteries, including lithium-ion batteries, may be used for a variety of target applications that require relatively higher levels of energy storage, power delivery and recharge cycle capability. These applications may include, for example, hybrid electric vehicles (HEVs), plug-in hybrid electric vehicles (PHEVs), battery electric vehicles (BEVs), solar/wind (renewable) power smoothing, power grid frequency regulation and power grid storage for peak shaving. Parties, ranging from manufacturers to distributors to end users of these batteries, have an interest in determining the useful life span of the batteries. Unfortunately, the lifespan may vary considerably depending on the target application and in particular the drive cycle of the application, which may include, for example, the depth of discharge and the charge and discharge rates.

Existing battery test procedures are typically application dependent (e.g., drive cycle dependent) and time consuming, sometimes taking a year or more to complete. The tests are therefore expensive and the results from one application specific test procedure may be difficult to apply or convert to another usage scenario.

What is needed, therefore, are improved methods and systems for cycle life testing of batteries that may be performed in a shorter time period and provide measurements useful to characterize a battery for a variety of target usage applications.

SUMMARY

The present disclosure describes methods and systems for application independent map-based cycle life testing of battery cells, such as, for example, lithium ion battery cells, with reduced testing time. The test may include the selection of a depth of discharge (DOD) to which the battery is lowered, followed by repeated discharge/charge cycles around the selected DOD. The discharge/charge cycles exercise the battery through a range of discharge depths (delta DODs). A test map, or matrix, may be generated to cover this range of discharge depth cycles versus a range of charge/discharge current levels associated with these cycles. The map may be configured to provide a model of a diverse set of usage conditions from which boundaries for a target application drive cycle may be selected. Target applications may include, for example, powering a hybrid electric vehicle or storing energy for an electric grid.

In some embodiments, a method is provided to select the depth of discharge cycle ranges for the test based on charge/discharge power curve measurements performed on the battery. Test parameters, such as the charge/discharge pulse durations, may be dynamically varied using feedback control loops based on battery voltage drift monitoring. End of test conditions may also be monitored to determine when the battery testing is complete. The conditions may include measurements of static capacity, dynamic charge/discharge power and/or elapsed time.

BRIEF DESCRIPTION OF DRAWINGS

The above-mentioned and other features of this disclosure, and the manner of attaining them, will become more apparent and better understood by reference to the following description of embodiments described herein taken in conjunction with the accompanying drawings, wherein:

FIG. 3 illustrates a test matrix of one exemplary embodiment consistent with the present disclosure;

DETAILED DESCRIPTION OF PREFERRED EMBODIMENTS

Figure 1:
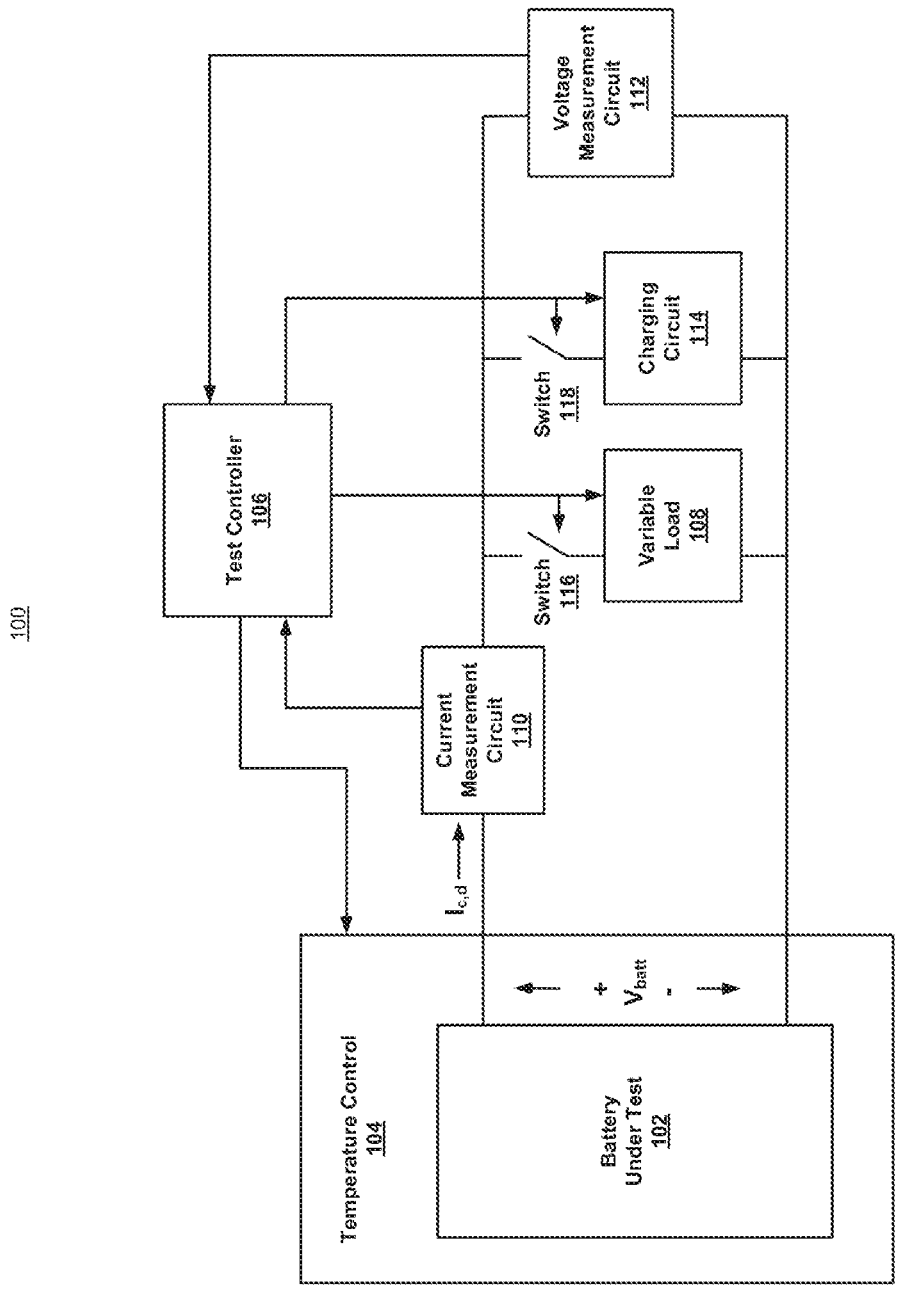
FIG. 1 illustrates a system block diagram of one exemplary embodiment consistent with the present disclosure.

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

The present disclosure relates to application independent map-based cycle life testing of battery cells, such as, for example, lithium ion battery cells, with reduced testing time. The test may include the selection of a depth of discharge (DOD) to which the battery is lowered, followed by repeated discharge/charge cycles around the selected DOD. The discharge/charge cycles exercise the battery through a range of discharge depths (delta DODs). A test map, or matrix, may be generated to cover this range of discharge depth cycles (along a first dimension of the matrix), versus a range of charge/discharge current levels associated with these cycles (along a second dimension of the matrix), as will be explained in greater detail below. The map may be configured to provide a model of a diverse set of usage conditions from which boundaries for a target application drive cycle may be selected. Target applications may include, for example, powering a hybrid electric vehicle or storing energy for an electric grid.

In some embodiments, a method is provided to select the depth of discharge cycle ranges for the test based on charge/discharge power curve measurements performed on the battery. Test parameters, such as the charge/discharge pulse durations, may be dynamically varied using feedback control loops based on battery voltage drift monitoring. End of test conditions may also be monitored to determine when the battery testing is complete. The conditions may include measurements of static capacity, dynamic charge/discharge power and/or elapsed time.

Referring now to FIG. 1, there is shown a system block diagram 100. A system configured to perform cycle life battery testing may include a test controller module 106, a current measurement circuit 110, a voltage measurement circuit 112, a variable load 108 and associated switch 116, a charging circuit 114 and associated switch 118, and a temperature control module 104. The battery (or cell) to be tested 102 may be maintained at a controlled temperature prior to and/or during the test by temperature control module 104, which in some embodiments may be an oven or other suitable heating or cooling device. The temperature setting may be determined and/or monitored by test controller module 106 through any suitable type of communication signal.

Current measurement circuit 110 may be configured to measure the electric current flowing through the battery 102 at various times during the cycle life testing, as will be explained in greater detail below. The current may be a charging current $I_c$ to re-charge the battery, or a discharging current $I_d$, to drain the battery. Voltage measurement circuit 112 may be configured to measure the voltage, $V_{batt}$ associated with the battery 102. Voltage measurements may be performed while the battery is being charged, drained, or while the battery is in an open circuit condition, depending on the stage of testing.

Variable load 108 may be configured to drain the battery 102, when switched into the circuit through switch 116 under the control of test controller module 106. A desired discharge current $I_d$ may be generated by adjusting the impedance of load 108 which may be set by controller 106. The discharge pulse duration (or pulse width) may also be set by controller 106 based on the timing of switch 116 state changes from open to close and back to open. For example, closing switch 116 for one second will cause a one second discharge current pulse to flow from battery 102 through the variable load 108. If, for example, the battery supplies V volts and the variable load is set to an impedance of R ohms, the discharge current pulse may be V/R amps.

Charging circuit 114 may be configured to charge the battery 102, when switched into the circuit through switch 118 under the control of test controller module 106. Charging circuit 114 may be set or adjusted by controller 106 to generate a desired charge current $I_c$. The charge pulse duration (or pulse width) may also be set by controller 106 based on the timing of switch 118 state changes.

Test controller module 106 may thus be configured to perform test operations on battery 102, for example as part of a cycle life test, as will be described in greater detail below. These test operations may include draining the battery to any desired depth of discharge and cycling the battery around that DOD through charge and discharge current pulses of controllable duration and amperage. Test controller module 106 may further be configured to monitor the current and voltage of the battery 102 during these test operations while also maintaining and monitoring the temperature of the battery.

Figure 2:
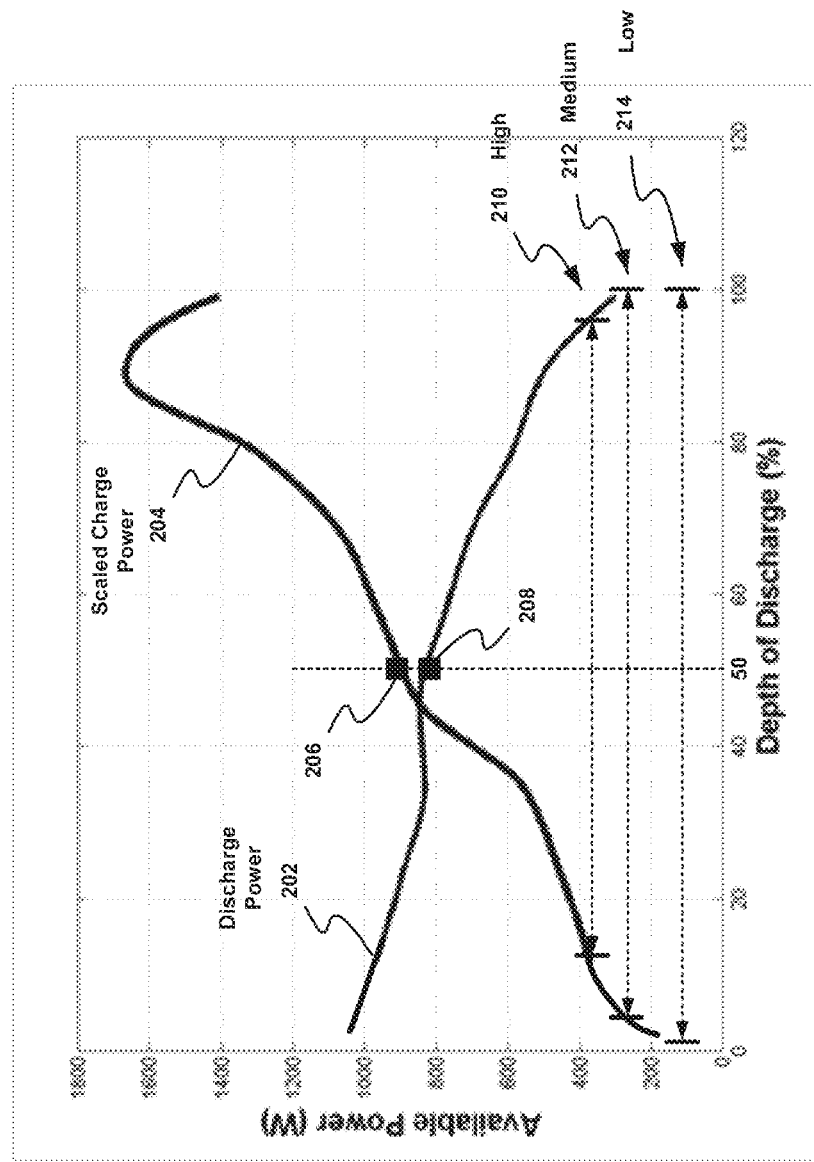
FIG. 2 illustrates power curves and selection of test parameters in accordance with an exemplary embodiment of the present disclosure.

Referring now to FIG. 2, there are shown power curves 200 which may be employed in the selection of test parameters for battery cycle life testing in accordance with an exemplary embodiment of the present disclosure. In some embodiments, initial or exploratory testing may be performed on battery 102 prior to the cycle life testing procedure. For example power curves 202, 204 may be estimated for the battery during discharge and charge conditions respectively. The power curves may chart the available power of the battery 102, for example in watts, as a function of the depth of discharge of the battery 102, expressed as a percentage of total charge, for example from 0 to 100%. So, as can be seen from the graph, the discharge power 202, or power delivered by the battery to a load, generally decreases as the depth of discharge increases. Similarly, the charge power 204, or power that the battery can accept from a recharging circuit or source, generally increases as the depth of discharge increases. In other words, a battery that is nearly fully charged (e.g., DOD close to 0%) may deliver a relatively higher power to a load while being able to accept a relatively lower power from a recharger. Likewise, a battery that is nearly fully discharged (e.g., DOD close to 100%) may deliver a relatively lower power to a load while being able to accept a relatively higher power from a recharger.

The charge power curve 204 may be scaled by a scale factor to compensate for the existence of efficiency differences between the charging and discharging cycles of the battery. In some embodiments, the scale factor may be in the range of 1.4 to 1.6 depending, at least in part, on battery chemistry.

A point on the scaled charge power curve 204 corresponding to a mid-point DOD is shown at 206 and a point on the discharge power curve 202 corresponding to the mid-point DOD is shown at 208. The mid-point DOD may be chosen, for example, to be in the range of 49-51%. A "rated" power for the battery 102 may be defined as the minimum of the power values corresponding to these two points 206, 208. The rated power may then be used to define one or more power test levels. In some embodiments, a "high power" test level may be defined as 39-41% of the rated power, a "medium power" test level may be defined as 24-26% of the rated power and a "low power" test level may be defined as 9-11% of the rated power.

DOD ranges, for the cycle life testing, may be chosen for each of the power test levels. The DOD range minimum value, for each power test level, may correspond to the DOD of the scaled charge power curve 204 at that power test level, while the DOD range maximum value, for each power test level, may correspond to the DOD of the discharge power curve 202 at that power test level. For example, in the case of the high power test level 210, the illustrated DOD range extends from the point on curve 204 to the point on curve 202 each corresponding to the selected "high power" value. Similar DOD minimum/maximum ranges are illustrated for "medium power" 212 and "low power" 214.

Charge and discharge current levels, for the cycle life testing, may also be chosen for each of the power test levels. In some embodiments, the discharge current may be set the power test level divided by the open circuit voltage of the battery and the charge current may be proportional to the discharge current, for example based on the scale factor discussed above.

FIG. 3 illustrates a test matrix 300 of one exemplary embodiment consistent with the present disclosure. The test matrix 300 of this example comprises 3 rows (e.g., one dimension of the matrix), where each row corresponds to a high current, medium current and low current test level. The test matrix 300 also comprises 6 columns (e.g., another dimension of the matrix), where each column corresponds to a DOD range which may be a parameter associated with a particular cycle life test. Elements of the test matrix of this example are shown as numerals 1, 2 or 3 which may indicate the relative importance of the cycle life test associated with those parameters (e.g., the row and column values), where 1 indicates a relatively higher importance and 3 indicates a relatively lower importance. A dash is used to indicate elements associated with test parameters that may be outside of the capabilities of the battery (based, for example on manufacturer specifications and/or cell chemistry) and therefore should not be used. These relative importance indicators may be employed to select a subset of cycle life tests to be performed where budget and/or time constraints prevent testing under all parameter combinations described by the matrix.

Figure 4:
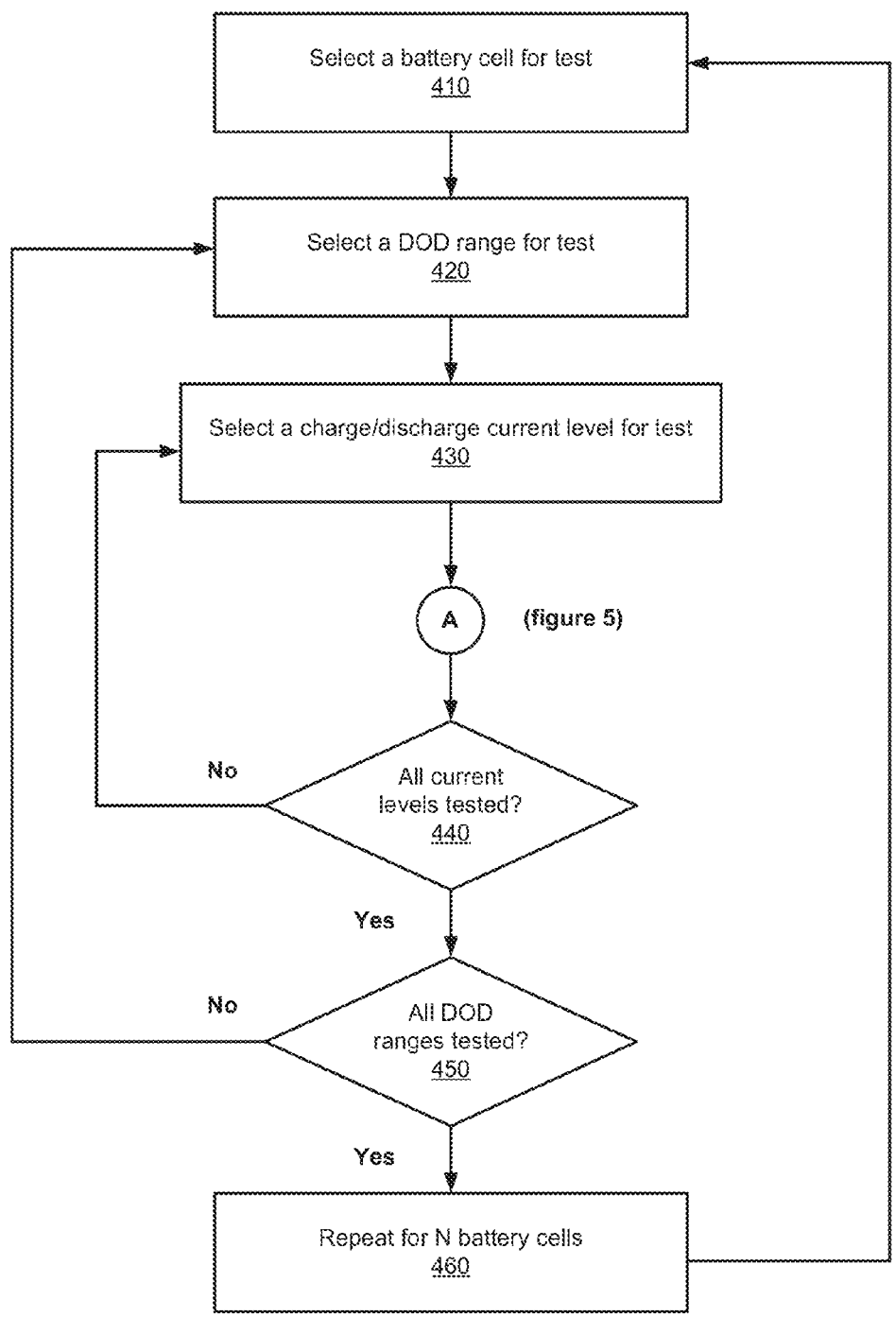
FIG. 4 illustrates a flowchart of operations of another exemplary embodiment consistent with the present disclosure.

FIG. 4 illustrates a flowchart of operations 400 of another exemplary embodiment consistent with the present disclosure. A battery cell is selected for cycle life testing at operation 410. A depth of discharge range is selected for the test at operation 420, for example from test matrix 300. Charging and discharging current levels are selected for the test in operation 430, for example from test matrix 300. Cycle life test operations are then performed on the battery cell using the selected parameters as will be described in greater detail in connection with FIG. 5 below. At operation 440, if additional current levels remain to be tested, a new current level is selected and the cycle test is repeated. At operation 450, if additional DOD ranges remain to be tested, a new DOD range is selected and the cycle test is repeated. At operation 460, the procedure is repeated for a new battery cell. In some embodiments, the procedure may be repeated for 3 or more battery cells to allow for analysis of statistical variability in the test results.

Figure 5:
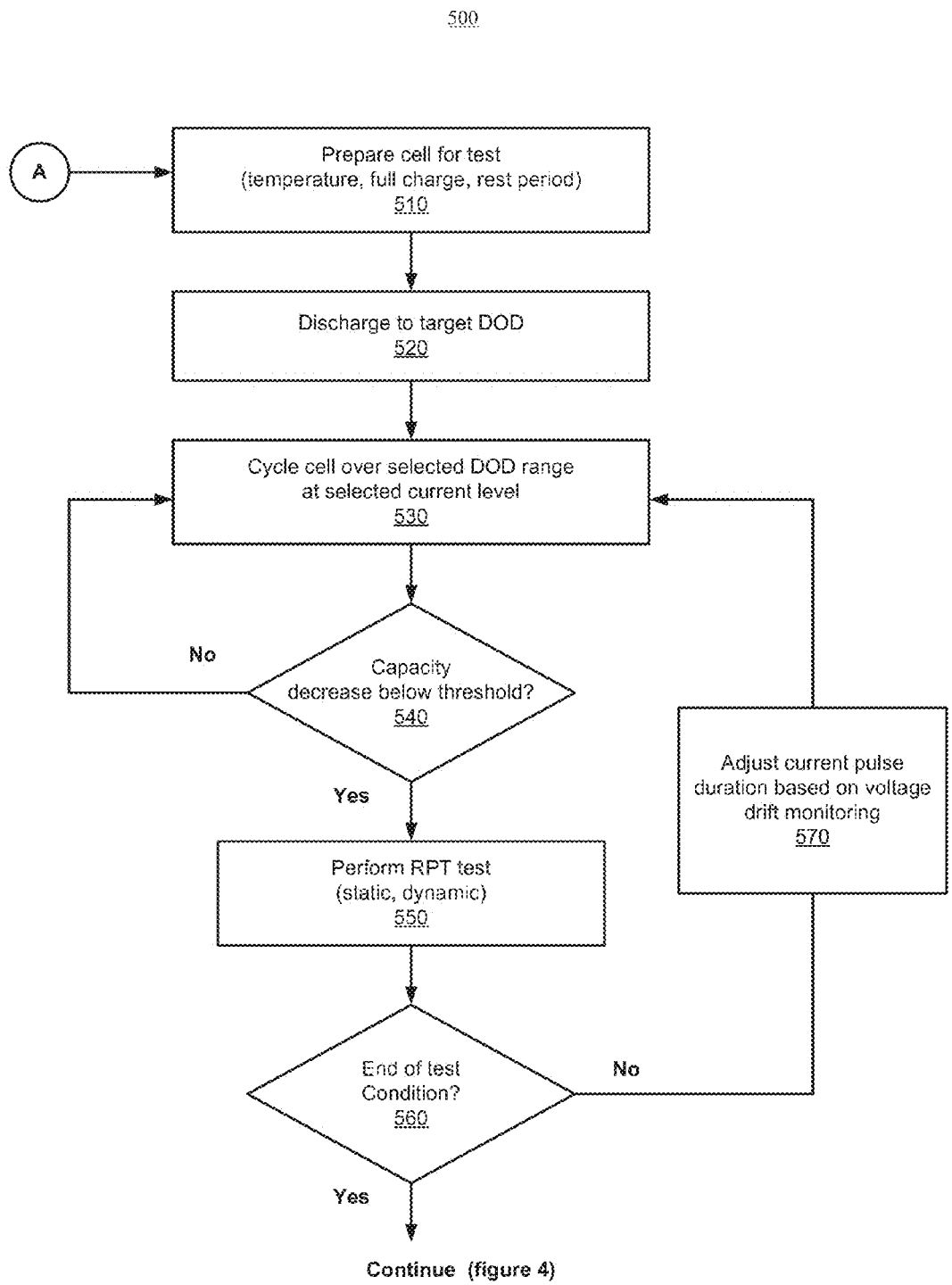
FIG. 5 illustrates a flowchart of operations of another exemplary embodiment consistent with the present disclosure.

FIG. 5 illustrates a flowchart of operations 500 of another exemplary embodiment consistent with the present disclosure. The operations of a cycle life test may include preparing a battery cell for the test operation 510. The preparation may include bringing the battery to a desired temperature (for example 30 degrees C.), charging the battery to a fully charged condition and allowing the battery to rest for desired period of time (for example 1 hour). At operation 520, the battery is discharged to a target DOD. The target, or nominal DOD, may be based on manufacturer's recommendation and/or cell chemistry characteristics, but will generally be lower for energy cells (for example, cells with a power to energy ratio less than 20) and higher for power cells (for example, cells with a power to energy ratio greater than 20).

At operation 530, the battery is cycled over a selected DOD range at a selected charging and discharging current level. For example, if the target DOD is 50%, the selected DOD range 10% and the current level medium, the battery may be cycled from 45% to 55% DOD at the medium charge/discharge current levels. At operation 540, if the battery's capacity has not decreased below a threshold the cycle test is repeated, at operation 530. Otherwise, at operation 550, a reference performance test (RPT) is performed on the battery. The RPT may include a static capacity test and a dynamic power test.

The static capacity test may be configured to measure the battery capacity, for example in Amp-hours, at a constant current discharge until a low voltage threshold is reached. The constant current discharge may be at a 1 C standard rate (e.g., N Amps/hour for an N Amp-hour cell). The dynamic power test (also known as a hybrid pulse power characterization or HPPC test) may be configured to measure dynamic power capability over the battery's useable voltage range using charge and discharge current pulses. The HPPC test may be performed at a 5 C standard rate (e.g., 5 N Amps/hour for an N Amp-hour cell).

If an end of test condition is detected, at operation 560, the cycle life test may be completed. One end of test condition may include the expiration of a test timer set to a predetermined threshold value. Another end of test condition may include a drop in static capacity of the battery below 80% of the beginning of life (e.g., pre-test) capacity, or, in other words an energy fade of 20% or more. Another end of test condition may include a drop in HPPC discharge power below 70% of the power of the battery at a 50% DOD at the beginning of life (e.g., pre-test) of the battery, or, in other words a power fade of 30% or more.

If an end of test condition is not detected, at operation 560, the charge/discharge current pulse duration may be adjusted based on voltage drift monitoring, at operation 570, and the cycle may be repeated, at operation 530. In some embodiments, a proportional-integral control closed loop feedback mechanism may be employed, based on monitored voltage drift of the battery during testing, to balance the charge and discharge coulombs.

In some embodiments, an initial exploratory testing stage may be conducted on the battery prior to the life cycle test. The purpose of the exploratory test may be to measure power charge and discharge curves, as shown in FIG. 2, which may be accomplished through the use of static capacity and/or dynamic power tests.

Figure 6:
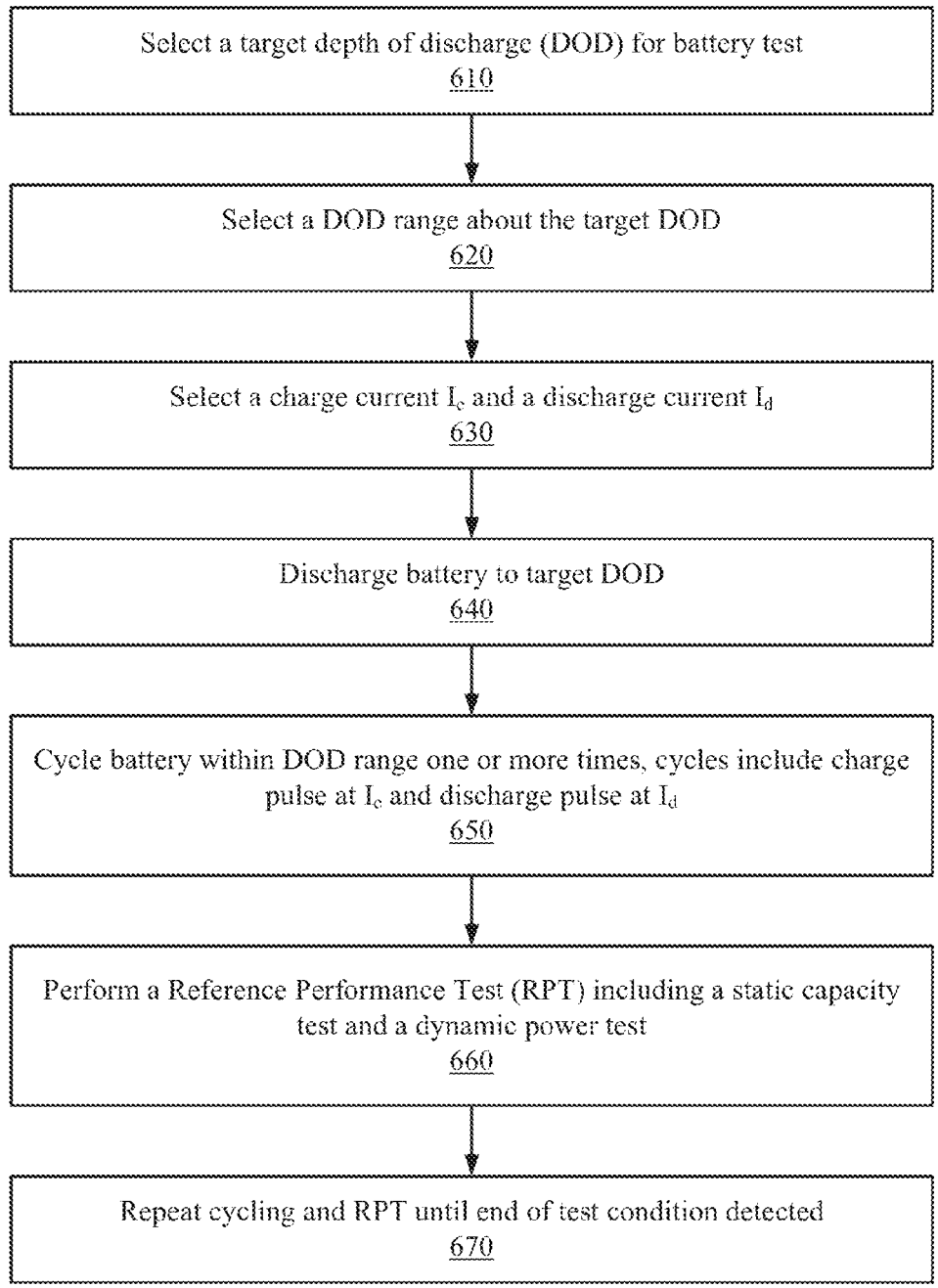
FIG. 6 illustrates a flowchart of operations of another exemplary embodiment consistent with the present disclosure.

FIG. 6 illustrates a flowchart of operations 600 of another exemplary embodiment consistent with the present disclosure. At operation 610, a target depth of discharge (DOD) is selected for the battery test. At operation 620, a DOD range about the target DOD is selected. At operation 630, a charge current and a discharge current are selected. At operation 640, the battery is discharged to the target DOD. Operation 650, the battery is cycled within the DOD range one or more times. The cycles include charge and discharge pulses at the selected current levels. At operation 660, a reference performance test (RPT) is performed on the battery. The RPT includes a static capacity test and a dynamic power test. At operation 670, the battery cycling and RPT are repeated until an end the test condition is detected.

Thus, the present disclosure provides methods and systems for application independent map-based cycle life testing of battery cells. While battery life typically depends on battery usage duty cycle, which may differ for each application or industry, the map-based approach presented herein (over multiple current levels and DOD ranges) maps battery life across diverse usage conditions. This enables a particular battery application to bracket duty cycles between relevant cells in the map to estimate upper and lower bounds for battery life. For example, a relatively complex application duty cycle may be expressed as a weighted sum of duty cycles corresponding to elements from the map, analogous to the way a time-varying signal may be composed of Fourier series components.

In view of the foregoing, it may be appreciated that the present disclosure also relates to an article comprising a non-transitory storage medium having stored thereon instructions that when executed by a machine result in the performance of the steps of the methods as described in the examples above such as, for example, in connection with the description associated with FIGS. 4-6. In some embodiments, the method operations may be implemented in software and executed by a processor or may be implemented in hardware such as, for example, an application specific integrated circuit (ASIC) or field programmable gate array (FPGA).

Figure 7:
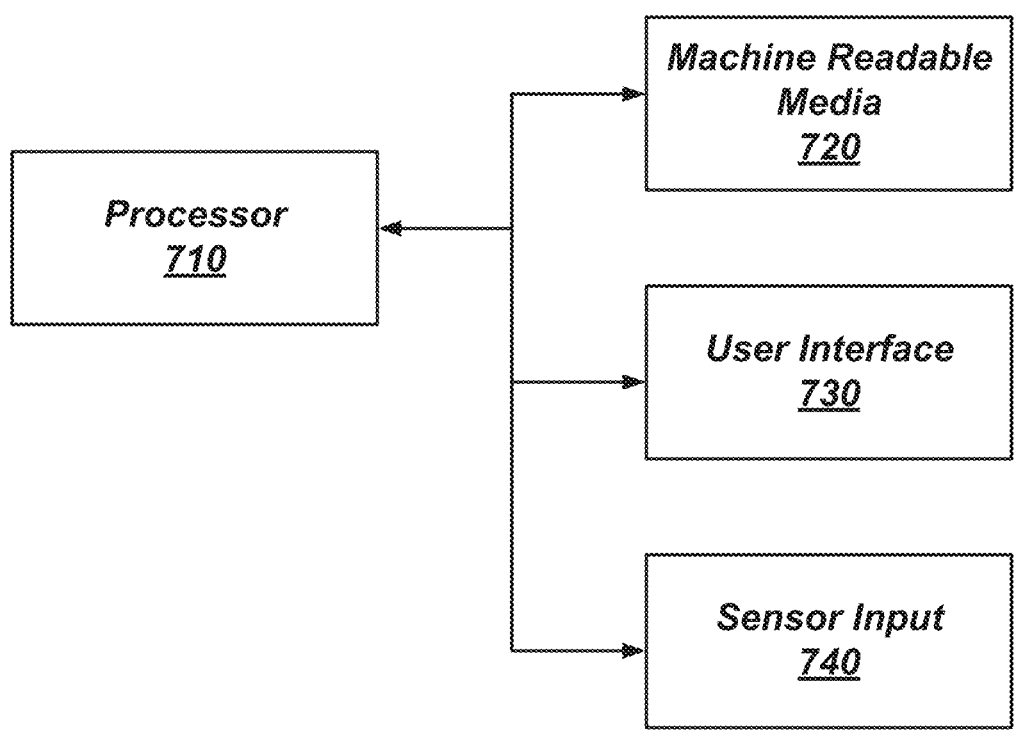
FIG. 7 illustrates a processor, machine readable media, user interface and sensor input that may be employed in an exemplary embodiment consistent with the present disclosure.

It should also be appreciated that the functionality described herein for the embodiments of the present invention may therefore be implemented by using hardware, software, or a combination of hardware and software, as desired. If implemented by software, a processor and a machine readable medium are required. The processor may be any type of processor capable of providing the speed and functionality required by the embodiments of the invention. Machine-readable memory includes any non-transitory media capable of storing instructions adapted to be executed by a processor. Non-transitory media include all computer-readable media with the exception of a transitory, propagating signal. Some examples of such memory include, but are not limited to, read-only memory (ROM), random-access memory (RAM), programmable ROM (PROM), erasable programmable ROM (EPROM), electronically erasable programmable ROM (EEPROM), dynamic RAM (DRAM), magnetic disk (e.g., floppy disk and hard drive), optical disk (e.g. CD-ROM), and any other device that can store digital information. The instructions may be stored on a medium in either a compressed and/or encrypted format. Accordingly, in the broad context of the present invention, and with attention to FIG. 7, the system and method for the herein disclosed cycle life testing may be accomplished with a processor (710) and machine readable media (720) and user interface (730) plus sensor input (740).

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method for cycle life testing of a battery, said method comprising:
    selecting a target depth of discharge (DOD) for said battery test;
    selecting a DOD range that includes a DOD range minimum value that is less than the target depth of discharge and a DOD range maximum value that is greater than the target depth of discharge for said battery test;
    selecting a charge current ($I_c$) and a discharge current ($I_d$) for said battery test;
    discharging said battery to said target DOD;
    cycling said battery within said DOD range one or more times, wherein said cycling comprises a charge pulse at $I_c$ and a discharge pulse $I_d$;
    performing a reference performance test (RPT) on said battery, wherein said RPT comprises a static capacity test and a dynamic power test;
    determining if an end of test condition has occurred;
    repeating said cycling and said RPT testing until said end of test condition occurs; and
    wherein said test is performed at a first power level, a second power level and a third power level, wherein said first power level is 39% to 41% of a rated power of said battery, said second power level is 24% to 26% of said rated power and said third power level is 9% to 11% of said rated power.

2. The method of claim 1, wherein said rated power is the minimum of a measured discharge power and a measured charge power of said battery, said measurement performed at a DOD of said battery in the range of 49% to 51%.

3. The method of claim 1, wherein said $I_d$ is selected as said test performance power level divided by the open circuit voltage of said battery at said target DOD.

4. The method of claim 3, wherein said $I_c$ is selected as said $I_d$ divided by a scale factor, said scale factor in the range of 1.4 to 1.6.

5. The method of claim 1, further comprising measuring battery voltage drift and adjusting the durations of said charge pulse and said discharge pulse based on closed loop proportional-integral control feedback in response to said measured battery voltage drift.

6. The method of claim 1, further comprising maintaining said battery at a temperature of 29 to 31 degrees Celsius during said battery test.

7. The method of claim 1, wherein said end of test condition comprises a drop in static capacity of said battery below 80% of a static capacity measurement of said battery performed prior to said battery test.

8. The method of claim 1, wherein said end of test condition comprises a drop in dynamic discharge power of said battery below 70% of a dynamic power measurement of said battery performed prior to said battery test.

9. The method of claim 1, wherein said end of test condition comprises exceeding a pre-determined testing time duration threshold.

10. An article comprising a non-transitory storage medium having stored thereon instructions that when executed by a machine result in the following operations:
    selecting a target depth of discharge (DOD) for said battery test;
    selecting a DOD range that includes a DOD range minimum value that is less than the target depth of discharge and a DOD range maximum value that is greater than the target depth of discharge for said battery test;
    selecting a charge current ($I_c$) and a discharge current ($I_d$) for said battery test;
    discharging said battery to said target DOD;
    cycling said battery within said DOD range one or more times, wherein said cycling comprises a charge pulse at $I_c$ and a discharge pulse $I_d$;
    performing a reference performance test (RPT) on said battery, wherein said RPT comprises a static capacity test and a dynamic power test;
    determining if an end of test condition has occurred;
    repeating said cycling and said RPT testing until said end of test condition occurs; and
    wherein said test is performed at a first power level, a second power level and a third power level, wherein said first power level is 39% to 41% of a rated power of said battery, said second power level is 24% to 26% of said rated power and said third power level is 9% to 11% of said rated power.

11. The article of claim 10, wherein said rated power is the minimum of a measured discharge power and a measured charge power of said battery, said measurement performed at a DOD of said battery in the range of 49% to 51%.

12. The article of claim 10, wherein said $I_d$ is selected as said test performance power level divided by the open circuit voltage of said battery at said target DOD.

13. The article of claim 12, wherein said $I_c$ is selected as said $I_d$ divided by a scale factor, said scale factor in the range of 1.4 to 1.6.

14. The article of claim 10, further comprising measuring battery voltage drift and adjusting the durations of said charge pulse and said discharge pulse based on closed loop proportional-integral control feedback in response to said measured battery voltage drift.

15. The article of claim 10, wherein said end of test condition comprises a drop in static capacity of said battery below 80% of a static capacity measurement of said battery performed prior to said battery test.

16. The article of claim 10, wherein said end of test condition comprises a drop in dynamic discharge power of said battery below 70% of a dynamic power measurement of said battery performed prior to said battery test.

17. The article of claim 10, wherein said end of test condition comprises exceeding a pre-determined testing time duration threshold.

\* \* \* \* \*